(12) United States Patent
Fujita et al.

(10) Patent No.: US 10,755,973 B2
(45) Date of Patent: Aug. 25, 2020

(54) METAL WIRING LAYER FORMING METHOD, METAL WIRING LAYER FORMING APPARATUS AND RECORDING MEDIUM

(71) Applicant: Tokyo Electron Limited, Tokyo (JP)

(72) Inventors: Keiichi Fujita, Kumamoto (JP); Kazutoshi Iwai, Kumamoto (JP); Nobutaka Mizutani, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/331,612

(22) PCT Filed: Aug. 29, 2017

(86) PCT No.: PCT/JP2017/030991
§ 371 (c)(1),
(2) Date: Mar. 8, 2019

(87) PCT Pub. No.: WO2018/074072
PCT Pub. Date: Apr. 26, 2018

(65) Prior Publication Data
US 2019/0229016 A1    Jul. 25, 2019

(30) Foreign Application Priority Data

Oct. 17, 2016  (JP) .................. 2016-203758

(51) Int. Cl.
*H01L 21/00* (2006.01)
*H01L 21/768* (2006.01)
(Continued)

(52) U.S. Cl.
CPC .... *H01L 21/76879* (2013.01); *C23C 18/1603* (2013.01); *C23C 18/1628* (2013.01);
(Continued)

(58) Field of Classification Search
CPC ............ H01L 21/76879; H01L 21/288; H01L 21/768; H01L 21/76843; H01L 21/76864;
(Continued)

(56) References Cited

U.S. PATENT DOCUMENTS

| 6,486,055 | B1 * | 11/2002 | Jung | ............... | H01L 21/288 |
| | | | | | 257/E21.174 |
| 2016/0372367 | A1 * | 12/2016 | Inatomi | ............... | C23C 18/1651 |
| 2017/0213762 | A1 * | 7/2017 | Gouk | .................. | C23C 18/1653 |

FOREIGN PATENT DOCUMENTS

| JP | H05-166939 A | 7/1993 |
| JP | 2010-185113 A | 8/2010 |
| JP | 2015-161020 A | 9/2015 |

OTHER PUBLICATIONS

International Search Report for International Application No. PCT/JP2017/030991, dated Oct. 24, 2017.

* cited by examiner

*Primary Examiner* — Richard A Booth
(74) *Attorney, Agent, or Firm* — Pearne & Gordon LLP

(57) ABSTRACT

A metal wiring layer can be formed within a recess of a substrate and an unnecessary plating layer is not left on a surface of the substrate. A metal wiring layer forming method includes forming a first plating layer 7 as a protection layer at least on a tungsten or tungsten alloy 4 formed on a bottom surface 3a of a recess 3 of a substrate 2; removing an unnecessary plating layer 7a formed on a surface 2a of the substrate 2; and forming a second plating layer 8 on the first plating layer 7 within the recess 3.

8 Claims, 2 Drawing Sheets

(51) Int. Cl.
*C23C 18/32* (2006.01)
*H01L 21/288* (2006.01)
*C23C 18/52* (2006.01)
*H01L 23/522* (2006.01)
*C23C 18/16* (2006.01)
*C23C 18/18* (2006.01)
*H01L 21/3213* (2006.01)
*H01L 23/532* (2006.01)

(52) U.S. Cl.
CPC ...... *C23C 18/1692* (2013.01); *C23C 18/1889* (2013.01); *C23C 18/32* (2013.01); *C23C 18/52* (2013.01); *H01L 21/288* (2013.01); *H01L 21/768* (2013.01); *H01L 21/76843* (2013.01); *H01L 21/76864* (2013.01); *H01L 21/76865* (2013.01); *H01L 21/76874* (2013.01); *H01L 23/522* (2013.01); *C23C 18/1651* (2013.01); *H01L 21/32134* (2013.01); *H01L 23/53209* (2013.01)

(58) Field of Classification Search
CPC ............. H01L 23/522; H01L 21/32134; H01L 23/53209; C23C 18/1603; C23C 18/1628; C23C 18/1692; C23C 18/1889; C23C 18/32; C23C 18/52; C23C 18/1651
See application file for complete search history.

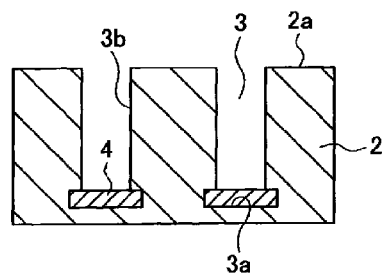
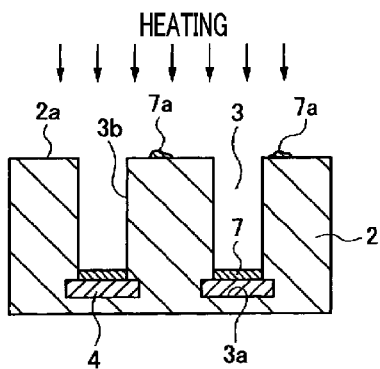
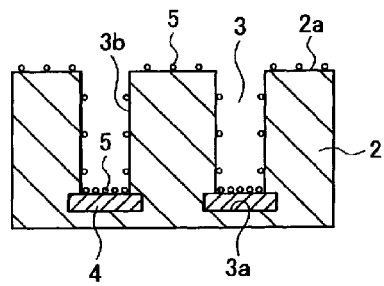
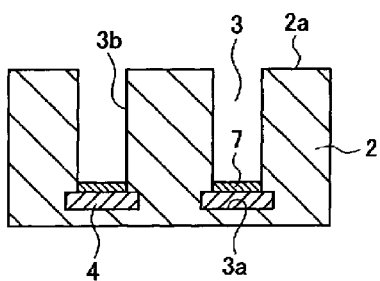
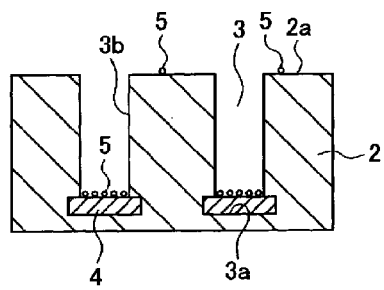
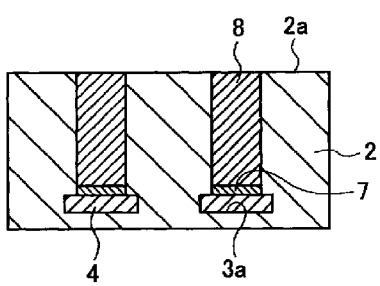
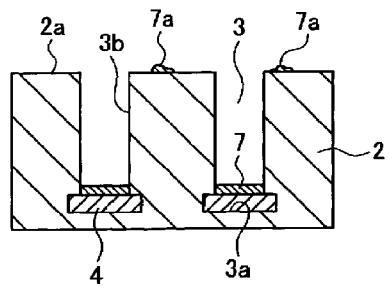

METAL WIRING LAYER FORMING METHOD, METAL WIRING LAYER FORMING APPARATUS AND RECORDING MEDIUM

CROSS-REFERENCE TO RELATED APPLICATION

This Application is a U.S. national phase application under 35 U.S.C. § 371 of PCT Application No. PCT/JP2017/030991 filed on Aug. 29, 2017, which claims the benefit of Japanese Patent Application No. 2016-203758 filed on Oct. 17, 2016, the entire disclosures of which are incorporated herein by reference.

TECHNICAL FIELD

The various aspects and embodiments described herein pertain generally to a metal wiring layer forming method and a metal wiring layer forming apparatus of forming a metal wiring layer on a substrate, and a recording medium.

BACKGROUND

Recently, semiconductor devices such as LSI have been required to have higher density in order to meet requirements for reducing the mounting space or for improving the processing rate. As an example of a technology that achieves the higher density, there has been known a multilayer wiring technology of manufacturing a multilayer substrate, such as a three-dimensional LSI or the like, by stacking multiple wiring substrates.

According to the multilayer wiring technology, a through-via-hole in which a conductive material such as copper (Cu) is buried is typically formed to penetrate each wiring substrate in order to obtain electrical connection between the wiring substrates.

When producing the wiring substrate, Cu is used as the conductive material and is buried in a recess of the substrate. In this case, a barrier film serving as a Cu diffusion suppressing film needs to be formed within the recess, and a seed film needs to be formed on this barrier film by electroless Cu plating. Accordingly, a wiring volume of a wiring layer may be reduced or a void may be generated in the buried Cu. Meanwhile, there has been developed a technique in which a catalyst is supplied within the recess of the substrate and a Co-based metal, instead of Cu, is buried within the recess by the electroless plating to be used as a wiring layer. In this case, the Co-based alloy within the recess is buried in a bottom-up shape on a lower electrode which is provided on a bottom surface of the recess.

When supplying the catalyst within the recess of the substrate, however, this catalyst may also adhere to a sidewall of the recess or a surface of the substrate. In such a case, the Co-based alloy may grow on the catalyst attached to the surface of the substrate as well, and a plating layer of the Co-based alloy formed on the surface of the substrate remains as an unnecessary plating layer. This unnecessary plating layer needs to be removed afterwards by using a chemical mechanical polishing method.

PRIOR ART DOCUMENT

Patent Document 1: Japanese Patent Laid-open Publication No. 2010-185113

DISCLOSURE OF THE INVENTION

Problems to be Solved by the Invention

In view of the foregoing, exemplary embodiments provide a metal wiring layer forming method and a metal wiring layer forming apparatus capable of forming a metal wiring layer within a recess of a substrate easily and simply by a plating processing without leaving an unnecessary plating layer on a surface of the substrate, and also provide a recording medium therefor.

Means for Solving the Problems

In one exemplary embodiment, a metal wiring layer forming method of forming a metal wiring layer in a substrate includes preparing the substrate provided with a recess having a lower electrode formed on a bottom surface thereof; forming a first plating layer as a protection layer at least on the lower electrode of the recess by performing a first plating processing on the substrate; removing an unnecessary plating layer, which is formed at the same time as the first plating layer is formed to adhere to a surface of the substrate, by cleaning the substrate; and forming a second plating layer on the first plating layer within the recess by performing a second plating processing on the substrate.

In another exemplary embodiment, a metal wiring layer forming apparatus configured to form a metal wiring layer on a substrate includes a first plating layer forming unit configured to form, by performing a first plating processing on a substrate provided with a recess having a lower electrode formed on a bottom surface thereof, a first plating layer as a protection layer at least on the lower electrode of the recess; an unnecessary plating layer cleaning unit configured to remove an unnecessary plating layer, which is formed at the same time as the first plating layer is formed to adhere to a surface of the substrate, by cleaning the substrate; and a second plating layer forming unit configured to form a second plating layer on the first plating layer within the recess by performing a second plating processing on the substrate.

In yet another exemplary embodiment, there is provided a computer-readable recording medium having stored thereon computer-executable instructions that, in response to execution, cause a metal wiring layer forming method to be performed. The metal wiring layer forming method of forming a metal wiring layer on a substrate comprises preparing the substrate provided with a recess having a lower electrode formed on a bottom surface thereof; forming a first plating layer as a protection layer at least on the lower electrode of the recess by performing a first plating processing on the substrate; removing an unnecessary plating layer, which is formed at the same time as the first plating layer is formed to adhere to a surface of the substrate, by cleaning the substrate; and forming a second plating layer on the first plating layer within the recess by performing a second plating processing on the substrate.

Means for Solving the Problems

According to the exemplary embodiments, it is possible to form the metal wiring layer within the recess of the substrate easily and simply without leaving the unnecessary plating layer on the surface of the substrate.

BRIEF DESCRIPTION OF THE DRAWINGS

FIG. 1A to FIG. 1G are diagrams illustrating a substrate on which a metal wiring layer forming method according to an exemplary embodiment is performed.

DETAILED DESCRIPTION

Figure 2:
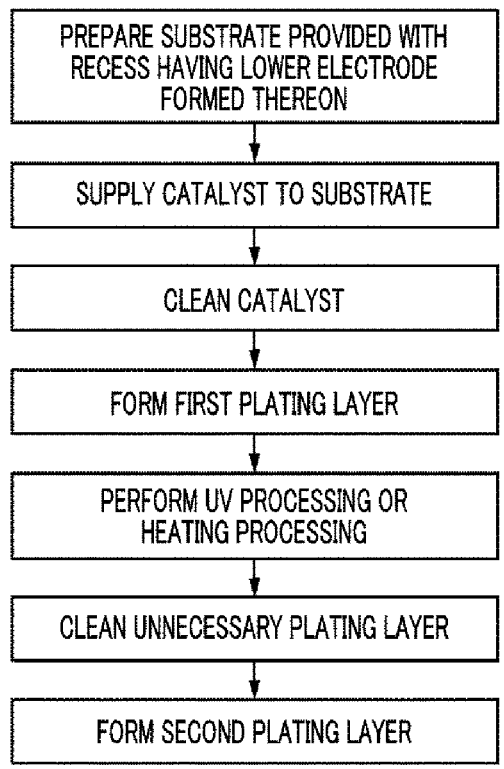
FIG. 2 is a flowchart illustrating the metal wiring layer forming method according to the exemplary embodiment.

Hereinafter, an exemplary embodiment will be described in detail with reference to FIG. 1A to FIG. 3.

A metal wiring layer forming method according to the exemplary embodiment is directed to forming a metal wiring layer on a silicon substrate (hereinafter, simply referred to as substrate) 2 which is made of, by way of example, a semiconductor wafer and has a recess 3, as illustrated in FIG. 1A to FIG. 1G.

As depicted in FIG. 1A to FIG. 1G, the substrate 2 is provided with the recess 3 having a bottom surface 3a and a side surface 3b.

Here, the substrate 2 is formed of a Si oxide film, and tungsten (W) or a tungsten alloy is buried on the bottom surface 3a of the recess 3 as a lower electrode (see FIG. 1A).

The substrate 2 having the above-described structure can be produced by a commonly known method in the art.

First, the silicon substrate 2 formed of the Si oxide film is prepared. Then, the recess 3 is formed in the substrate 2 by etching.

Thereafter, the tungsten (W) or tungsten alloy 4 is buried on the bottom surface 3a of the recess 3 of the substrate 2 by CVD.

Now, a metal wiring layer forming apparatus 10 configured to form a metal wiring layer on the substrate 2 having the above-described recess 3 will be explained with reference to FIG. 3.

The metal wiring layer forming apparatus 10 is equipped with a catalyst supplying unit 11 configured to supply a catalyst to the substrate 2; a catalyst cleaning unit 12 configured to remove the catalyst except the one supplied on the tungsten or tungsten alloy 4 formed on the bottom surface 3a of the recess 3 by performing pre-cleaning on the substrate 2; a first plating layer forming unit 13 configured to form a first plating layer 7 as a protection layer at least on the tungsten or tungsten alloy 4 by performing a first plating processing on the substrate 2; an unnecessary plating layer cleaning unit 15 configured to remove, by cleaning the substrate 2, an unnecessary plating layer 7a, which is formed at the same time as the first plating layer 7 to adhere to a surface of the substrate 2; and a second plating layer forming unit 16 configured to form a second plating layer 8 on the first plating layer 7 within the recess 3 by performing a second plating processing on the substrate 2.

Further, a UV processing unit or heating unit 14 configured to easily remove the unnecessary plating layer 7a by performing a UV processing or a heating processing on the substrate 2 is provided between the first plating layer forming unit 13 and the unnecessary plating layer cleaning unit 15.

Further, the individual components of the above-described metal wiring layer forming apparatus 10, for example, the catalyst supplying unit 11, the catalyst cleaning unit 12, the first plating layer forming unit 13, the UV processing unit or heating unit 14, the unnecessary plating layer cleaning unit 15 and the second plating layer forming unit 16 are all operated by a control device 20 according to various kinds of programs recorded in a recording medium 21 provided in the control device 20, so that various kinds of processings are performed on the substrate 2. Here, the recording medium 21 stores thereon various kinds of setup data or various kinds of programs such as a metal wiring layer forming program to be described later. A computer-readable memory such as ROM or RAM, a disk type recording medium such as a hard disk, a CD-ROM, a DVD-ROM or a flexible disk, or any of various kinds of commonly known mediums may be used as the recording medium 21.

Now, an operation according to the exemplary embodiment having the above-described configuration will be explained with reference to FIG. 1A to FIG. 3.

As described above, the recess 3 is formed in the substrate (silicon substrate) 2, which is formed of the semiconductor wafer or the like, and the substrate 2 in which the tungsten or tungsten alloy 4 is formed on the bottom surface 3a of the recess 3 is transferred into the metal wiring layer forming apparatus 10 according to the exemplary embodiment. Here, the substrate 2 is provided with the recess 3 having the bottom surface 3a, and the tungsten or tungsten alloy is formed on the bottom surface 3a of this recess 3 (see FIG. 1A).

Here, a method of forming the recess 3 in the substrate 2 may be appropriately selected from various commonly known methods in the art. To be specific, a general-purpose technique using a fluorine-based gas or a chlorine-based gas may be used as a dry etching technique, for example. Especially, to form a hole having a large aspect ratio (hole depth/hole diameter), a method using an ICP-RIE (Inductively Coupled Plasma Reactive Ion Etching) technique capable of carrying out a deep etching processing with a high speed may be appropriately adopted. Particularly, a Bosch process in which an etching process using sulfur hexafluoride ($SF_6$) and a protection process using a Teflon (registered trademark)-based gas such as $C_4F_8$ are repeatedly performed may be appropriately employed.

Figure 3:
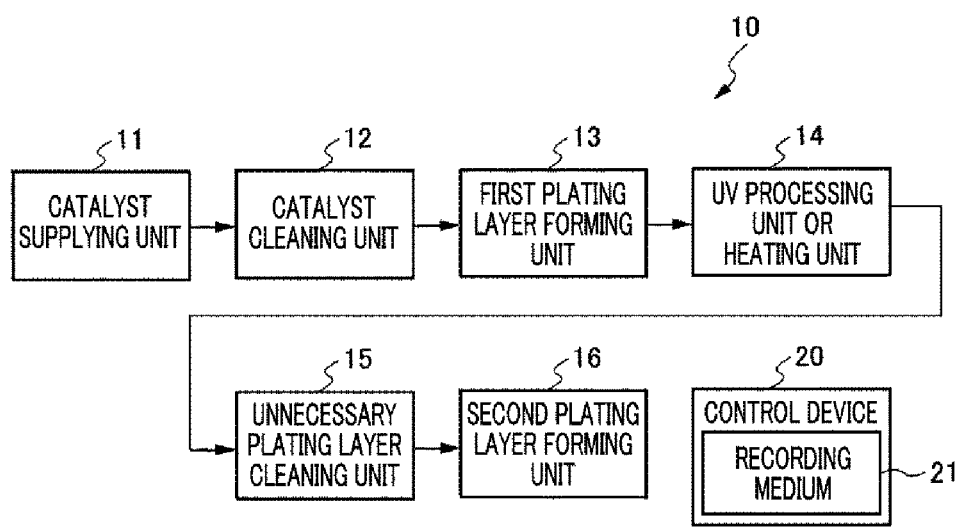
FIG. 3 is a block diagram illustrating a metal wiring layer forming apparatus according to the exemplary embodiment.

Subsequently, in the metal wiring layer forming apparatus 10, the substrate 2 having the recess 3 is carried into the catalyst supplying unit 11 as shown in FIG. 2 and FIG. 3, and the catalyst is supplied to the substrate 2 in this catalyst supplying unit 11 (see FIG. 1B).

Now, this catalyst supplying process in the catalyst supplying unit 11 will be further elaborated.

As depicted in FIG. 1B, in the catalyst supplying process, an aqueous solution including Pd ions produced from palladium chloride is discharged to the substrate 2 by a nozzle, for example, so that the Pd ions serving as the catalyst are adsorbed to the surface of the substrate 2. The Pd ions are easily adsorbed to some surface materials whereas they are not easily adsorbed to some surface materials. It is easy to allow the Pd ions to be adsorbed to the tungsten or tungsten alloy on the bottom surface 3a whereas it is difficult to allow the Pd ions to be adsorbed to the silicon oxide film. Using this difference, it is possible to adsorb a larger amount of the Pd ions to the bottom surface 3a.

Alternatively, in case of forming a catalyst 5 on the tungsten or tungsten alloy 4 of the recess 3 of the substrate 2 as well as the side surface 3b of the recess 3 and a surface 2a of the substrate 2, a catalyst solution including a catalyst having catalysis to accelerate a plating reaction, for example, a catalyst formed of nanoparticles may be used. Here, the nanoparticles refer to particles which has catalysis and whose average particle diameter is equal to or less than 20 nm, for example, within a range from, e.g., 0.5 nm to 20 nm. An element constituting the nanoparticle may be, by way of non-limiting example, palladium, gold, platinum, or the like.

Further, ruthenium may be used as the element constituting the nanoparticle.

A method of measuring the average particle diameter of the nanoparticles is not particularly limited, and various types of methods may be employed. By way of example, when measuring the average particle diameter of the nanoparticles in the catalyst solution, a dynamic light scattering method or the like may be used. In the dynamic light scattering method, a laser beam is irradiated to the nanoparticles dispersed in the catalyst solution, and the average particle diameter of the nanoparticles is calculated by observing scattered light.

Further, in case of measuring the average particle diameter of the nanoparticles adsorbed on the recess 3 of the substrate 2, a preset number of nanoparticles, for example, twenty nanoparticles are detected from an image which is obtained by using TEM, SEM or the like, and an average particle diameter of these nanoparticles may be calculated.

Now, the catalyst solution containing the catalyst composed of the nanoparticles will be discussed. The catalyst solution contains ions of a metal constituting the nanoparticle serving as the catalyst. By way of example, if the nanoparticle is made of palladium, a palladium compound, such as palladium chloride, as a source of palladium ions is contained in the catalyst solution.

A specific composition of the catalyst solution is not particularly limited. Desirably, however, the composition of the catalyst solution is set such that a viscosity coefficient of the catalyst solution is equal to or less than 0.01 Pa·s. By setting the viscosity coefficient of the catalyst solution to be in this range, the catalyst solution can be sufficiently diffused down to the bottom surface 3a of the recess 3 of the substrate 2 even if the diameter of the recess 3 of the substrate 2 is small. Accordingly, the catalyst can be adsorbed to the bottom surface 3a of the recess 3 of the substrate 2 more securely.

Desirably, the catalyst in the catalyst solution is coated with a dispersant. Accordingly, interfacial energy at an interface of the catalyst can be reduced. As a result, it is assumed that the diffusion of the catalyst within the catalyst solution can be more accelerated, so that the catalyst can reach the bottom surface 3a of the recess 3 of the substrate 2 in a shorter time period. Further, it is also assumed that an increase in the particle diameter of the catalyst that might be caused by agglomeration of multiple catalysts can be suppressed, so that the diffusion of the catalyst in the catalyst solution can be further accelerated.

A method of preparing the catalyst coated with the dispersant is not particularly limited. By way of example, a catalyst solution containing the catalyst which is previously coated with the dispersant may be used.

Specifically, polyvinylpyrrolidone (PVP), polyacrylic acid (PAA), polyethyleneimine (PEI), tetramethylammonium (TMA), citric acid or the like may be used as the dispersant, desirably.

Besides, various chemical materials for controlling the characteristic may be added to the catalyst solution.

As stated above, in the catalyst supplying unit 11, the catalyst 5 is supplied onto the tungsten or tungsten alloy 4 formed on the bottom surface 3a of the recess 3, the side surface 3b of the recess 3 and the surface 2a of the substrate 2.

The substrate 2 is then sent into the catalyst cleaning unit 12 from the catalyst supplying unit 11. In the catalyst cleaning unit 12, the substrate 2 is subjected to pre-cleaning by using a cleaning liquid such as, but not limited, DHF. At this time, the catalyst 5 except the one formed on the tungsten or tungsten alloy 4, that is, the catalyst 5 formed on the side surface 3b of the recess 3 and the surface 2a of the substrate 2 is removed (see FIG. 1C).

In this case, since the adsorption force of the catalyst 5 to the tungsten or tungsten alloy 4 is larger than that of the catalyst 5 to the side surface 3b of the recess 3 and the surface 2a of the substrate 2 as stated above, it is possible to selectively remove the catalyst 5 formed on the side surface 3b of the recess 3 and the surface 2a of the substrate 2 by the cleaning.

Then, the substrate 2 is sent into the first plating layer forming unit 13 from the catalyst cleaning unit 12. In the first plating layer forming unit 13, a first plating processing is performed by supplying the plating liquid onto the substrate 2, so that the first plating layer 7 as the protection layer is formed at least on the tungsten or tungsten alloy 4 formed on the bottom surface 3a of the recess 3.

Here, as illustrated in FIG. 1D, since the catalyst 5 formed on the side surface 3b of the recess 3 and the surface 2a of the substrate 2 is removed in the previous process, even if the first plating processing is performed, the first plating layer 7 is difficult to form on the side surface 3b of the recess 3 and the surface 2a of the substrate 2. Even if the catalyst 5 is removed in the catalyst cleaning unit 12, however, it is assumed that a part of the catalyst 5 may remain on, for example, the surface 2a of the substrate 2. In this case, when performing the first plating processing, the plating layer 7a is formed on the surface 2a of the substrate 2 through the catalyst 5. Since this plating layer 7a left on the surface 2a of the substrate 2 is the unnecessary plating layer 7a, and ends up being a foreign substance defect, the plating layer 7a needs to be removed.

Further, the first plating layer 7 may be a plating layer made of cobalt or cobalt alloy such as Co, CoB or CoP or nickel or nickel alloy such as Ni, NiB or NiP, which is formed through the catalyst 5.

Thereafter, the substrate 2 is delivered from the first plating layer forming unit 13 to the UV processing unit or heating unit 14. In this UV processing unit or heating unit 14, a UV processing or a heating processing is performed on the substrate 2, so that the unnecessary plating layer 7a formed on the surface 2a of the substrate 2 is heated. Then, by cleaning the substrate 2 in the unnecessary plating layer cleaning unit 15 to be described later, the unnecessary plating layer 7a can be easily removed (see FIG. 1E).

Subsequently, the substrate 2 is sent from the UV processing unit or heating unit 14 into the unnecessary plating layer cleaning unit 15. In this unnecessary plating layer cleaning unit 15, a cleaning processing is performed on the substrate 2 by using a cleaning liquid including an organic acid. In this case, since the unnecessary plating layer 7a formed on the surface 2a of the substrate 2 is UV-processed or heated previously, this unnecessary plating layer 7a can be removed easily and simply (see FIG. 1F).

Afterwards, the substrate 2 is sent from the unnecessary plating layer cleaning unit 15 into the second plating layer forming unit 16. In this second plating layer forming unit 16, the second plating layer 8 is formed in a bottom-up shape on the first plating layer 7, which is formed on the tungsten or tungsten alloy 4 within the recess 3 of the substrate 2, by using the first plating layer 7 as a catalyst (see FIG. 1G).

Through these processes, the second plating layer 8 can be filled within the recess 3 of the substrate 2. In this case, a material forming the second plating layer 8 is the same as a material forming the first plating layer 7. The first plating layer 7 and the second plating layer 8 formed on the first plating layer 7 serve as metal wiring layers 7 and 8.

According to the present exemplary embodiment, the tungsten or tungsten alloy 4 is formed within the recess 3 of the substrate 2 as the lower electrode, and by forming the first plating layer 7 and the second plating layer 8 on this tungsten or tungsten alloy 4, the first plating layer 7 and the second plating layer 8 can be buried within the recess 3. Further, after the first plating layer 7 is formed on the tungsten or tungsten alloy 4 as the protection layer, the unnecessary plating layer 7a on the surface 2a of the substrate 2, which is formed at the same time as the first plating layer 7 is formed, is removed. Then, the second plating layer 8 is formed on top of the first plating layer 7 within the recess 3. Therefore, the unnecessary plating layer 7a formed on the surface 2a of the substrate 2 is not left as the foreign substance defect or does not grow.

Furthermore, the unnecessary plating layer 7a formed on the surface 2a of the substrate 2 can be suppressed from being left as the foreign substance defect.

Besides, since the unnecessary plating layer 7a is not left on the surface 2a of the substrate 2 as the foreign substance defect, this unnecessary plating layer 7a need not be removed by chemical mechanical polishing.

In addition, in the above-described exemplary embodiment, the first plating layer forming unit 13, the unnecessary plating layer cleaning unit 15 and the second plaiting layer forming unit 16 may be constituted by using the same spinner.

Moreover, in the above-described exemplary embodiment, the UV processing unit or heating unit 14 need not necessarily be provided. Further, though the above exemplary embodiment has been described for the case where the tungsten or tungsten alloy 4 is previously formed on the bottom surface 3a of the recess 3 of the substrate 2, this tungsten or tungsten alloy 4 may be omitted depending on the material of the plating layer.

EXPLANATION OF CODES

2: Substrate
2a: Surface
3: Recess
3a: Bottom surface
3b: Side surface
4: Tungsten or tungsten alloy
5: Catalyst
7: First plating layer
7a: Unnecessary plating layer
8: Second plating layer
10: Metal wiring layer forming apparatus
11: Catalyst supplying unit
12: Catalyst cleaning unit
13: First plating layer forming unit
14: UV processing unit or heating unit
16: Second plating layer forming unit
20: Control device
21: Recording medium

We claim:

1. A metal wiring layer forming method of forming a metal wiring layer in a substrate, comprising:
   preparing the substrate provided with a recess having a lower electrode formed on a bottom surface thereof;
   forming a first plating layer as a protection layer at least on the lower electrode of the recess by performing a first plating processing on the substrate;
   removing an unnecessary plating layer, which is formed at the same time as the first plating layer is formed to adhere to a surface of the substrate, by cleaning the substrate; and
   forming a second plating layer on the first plating layer within the recess by performing a second plating processing on the substrate.

2. The metal wiring layer forming method of claim 1, further comprising:
   supplying a catalyst to the substrate prior to the removing of the unnecessary plating layer; and
   removing the catalyst except the catalyst formed on the lower electrode by performing pre-cleaning on the substrate.

3. The metal wiring layer forming method of claim 1, wherein a UV processing or a heating processing is performed on the substrate between the forming of the first plating layer and the removing of the unnecessary plating layer to allow the unnecessary plating layer to be easily removed.

4. The metal wiring layer forming method of claim 1, wherein the lower electrode includes tungsten or tungsten alloy, and
   the first plating layer and the second plating layer include cobalt or cobalt alloy.

5. A metal wiring layer forming apparatus configured to form a metal wiring layer on a substrate, comprising:
   a first plating layer forming unit configured to form, by performing a first plating processing on a substrate provided with a recess having a lower electrode formed on a bottom surface thereof, a first plating layer as a protection layer at least on the lower electrode of the recess;
   an unnecessary plating layer cleaning unit configured to remove an unnecessary plating layer, which is formed at the same time as the first plating layer is formed to adhere to a surface of the substrate, by cleaning the substrate; and
   a second plating layer forming unit configured to form a second plating layer on the first plating layer within the recess by performing a second plating processing on the substrate.

6. The metal wiring layer forming apparatus of claim 5, further comprising:
   a catalyst supplying unit configured to supply a catalyst to the substrate; and
   a catalyst cleaning unit configured to remove the catalyst except the catalyst formed on the lower electrode by performing pre-cleaning on the substrate.

7. The metal wiring layer forming apparatus of claim 5, further comprising:
   a UV processing unit or heating unit configured to perform a UV processing or a heating processing on the substrate to allow the unnecessary plating layer to be easily removed.

8. A computer-readable recording medium having stored thereon computer-executable instructions that, in response to execution, cause a metal wiring layer forming method to be performed,
   wherein the metal wiring layer forming method of forming a metal wiring layer on a substrate comprises:
   preparing the substrate provided with a recess having a lower electrode formed on a bottom surface thereof;
   forming a first plating layer as a protection layer at least on the lower electrode of the recess by performing a first plating processing on the substrate;

removing an unnecessary plating layer, which is formed at the same time as the first plating layer is formed to adhere to a surface of the substrate, by cleaning the substrate; and forming a second plating layer on the first plating layer within the recess by performing a second plating processing on the substrate.

\* \* \* \* \*